(12) United States Patent
Horikoshi et al.

(10) Patent No.: US 8,410,577 B2
(45) Date of Patent: Apr. 2, 2013

(54) SEMICONDUCTOR DEVICE

(75) Inventors: Katsu Horikoshi, Gunma (JP);
Hisayoshi Uchiyama, Gunma (JP);
Takashi Noma, Gunma (JP); Yoshinori Seki, Gunma (JP); Hiroshi Yamada, Kanagawa (JP); Shinzo Ishibe, Gunma (JP); Hiroyuki Shinogi, Gunma (JP)

(73) Assignees: SANYO Semiconductor Co., Ltd., Ora-gun (JP); Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/103,857

(22) Filed: Apr. 16, 2008

(65) Prior Publication Data

US 2008/0258258 A1 Oct. 23, 2008

(30) Foreign Application Priority Data

Apr. 20, 2007 (JP) ................. 2007-112336

(51) Int. Cl.
*H01L 29/92* (2006.01)

(52) U.S. Cl. ............... 257/532; 257/516; 257/E29.343; 257/E21.008; 438/171; 438/190; 438/210; 438/238; 438/239

(58) Field of Classification Search ............... 438/674, 438/668, 672, 745, 667, 171, 190, 210, 238, 438/239, 167, 186, 197, 200; 257/E21.508, 257/E21.597, E23.011, E23.02, E23.021, 257/E25.013, 516, 532, E29.343, E21.008
See application file for complete search history.

(56) References Cited

U.S. PATENT DOCUMENTS

| | | | |
|---|---|---|---|
| 4,227,975 A | 10/1980 | Hartman et al. | |
| 4,242,695 A | 12/1980 | Ouchi et al. | |
| 5,644,124 A | 7/1997 | Hamada et al. | |
| 5,656,816 A | 8/1997 | Tanaka | |
| 5,804,827 A | 9/1998 | Akagawa et al. | |
| 5,811,868 A * | 9/1998 | Bertin et al. | 257/516 |
| 5,929,440 A | 7/1999 | Fisher | |

(Continued)

FOREIGN PATENT DOCUMENTS

| | | | |
|---|---|---|---|
| JP | 02303010 A | * | 12/1990 |
| JP | 3-227046 | | 10/1991 |

(Continued)

OTHER PUBLICATIONS

European Search Report, mailed Jun. 10, 2009, directed to European Patent Application No. 06026027.0; 6 pages.

(Continued)

*Primary Examiner* — Matthew Reames
*Assistant Examiner* — Ermias Woldegeorgis
(74) *Attorney, Agent, or Firm* — Morrison & Foerster LLP

(57) ABSTRACT

The invention provides a semiconductor device which has a capacitor element therein to achieve size reduction of the device, the capacitor element having larger capacitance than conventional. A semiconductor integrated circuit and pad electrodes are formed on the front surface of a semiconductor substrate. A second insulation film is formed on the side and back surfaces of the semiconductor substrate, and a capacitor electrode is formed between the back surface of the semiconductor substrate and the second insulation film, contacting the back surface of the semiconductor substrate. The second insulation film is covered by wiring layers electrically connected to the pad electrodes, and the wiring layers and the capacitor electrode overlap with the second insulation film being interposed therebetween. Thus, the capacitor electrode, the second insulation film and the wiring layers form capacitors.

9 Claims, 8 Drawing Sheets

U.S. PATENT DOCUMENTS

| | | | |
|---|---|---|---|
| 5,973,337 | A | 10/1999 | Knapp et al. |
| 6,165,814 | A * | 12/2000 | Wark et al. ............ 438/108 |
| 6,228,676 | B1 | 5/2001 | Glenn et al. |
| 6,229,223 | B1 | 5/2001 | Watanabe |
| 6,326,689 | B1 | 12/2001 | Thomas |
| 6,372,351 | B1 | 4/2002 | Takemiya et al. |
| 6,384,459 | B1 | 5/2002 | Matsuda |
| 6,455,774 | B1 | 9/2002 | Webster |
| 6,465,786 | B1 | 10/2002 | Rhodes |
| 6,552,344 | B1 | 4/2003 | Sone et al. |
| 6,563,192 | B1 * | 5/2003 | Corisis et al. ............ 257/532 |
| 6,646,289 | B1 | 11/2003 | Badehi |
| 6,693,337 | B2 | 2/2004 | Yoneda et al. |
| 6,717,147 | B2 | 4/2004 | Oda |
| 6,838,748 | B2 | 1/2005 | Ishio et al. |
| 6,962,829 | B2 * | 11/2005 | Glenn et al. ............ 438/33 |
| 7,102,238 | B2 | 9/2006 | Noma et al. |
| 7,180,149 | B2 | 2/2007 | Yamamoto et al. |
| 7,183,589 | B2 | 2/2007 | Kameyama et al. |
| 7,274,101 | B2 | 9/2007 | Tomita et al. |
| 7,332,783 | B2 | 2/2008 | Misawa |
| 7,332,789 | B2 * | 2/2008 | Violette ............ 257/510 |
| 7,374,971 | B2 | 5/2008 | Yuan et al. |
| 7,374,972 | B2 | 5/2008 | Kwon et al. |
| 7,413,931 | B2 | 8/2008 | Noma et al. |
| 7,569,409 | B2 | 8/2009 | Lin et al. |
| 7,576,361 | B2 | 8/2009 | Agranov et al. |
| 7,759,779 | B2 | 7/2010 | Okada et al. |
| 7,781,250 | B2 | 8/2010 | Wang et al. |
| 2001/0050408 | A1 * | 12/2001 | Bernstein et al. ............ 257/532 |
| 2002/0005583 | A1 * | 1/2002 | Harada et al. ............ 257/758 |
| 2002/0019069 | A1 | 2/2002 | Wada |
| 2003/0160185 | A1 | 8/2003 | Homme |
| 2003/0230805 | A1 | 12/2003 | Noma et al. |
| 2004/0012095 | A1 | 1/2004 | Matsuyama et al. |
| 2004/0016983 | A1 | 1/2004 | Misawa |
| 2004/0076797 | A1 | 4/2004 | Zilber et al. |
| 2004/0108588 | A1 | 6/2004 | Gilleo |
| 2004/0130640 | A1 | 7/2004 | Fujimor |
| 2004/0161920 | A1 | 8/2004 | Noma |
| 2004/0183152 | A1 | 9/2004 | Yoneda et al. |
| 2004/0187916 | A1 | 9/2004 | Hezel |
| 2004/0188699 | A1 | 9/2004 | Kameyama et al. |
| 2005/0009238 | A1 | 1/2005 | Okigawa |
| 2005/0048740 | A1 | 3/2005 | Noma et al. |
| 2005/0077458 | A1 | 4/2005 | Ma et al. |
| 2005/0258447 | A1 | 11/2005 | Oi et al. |
| 2006/0079019 | A1 | 4/2006 | Kim |
| 2007/0145420 | A1 * | 6/2007 | Okada et al. ............ 257/228 |
| 2007/0145590 | A1 | 6/2007 | Noma et al. |
| 2007/0210437 | A1 | 9/2007 | Noma et al. |
| 2008/0277793 | A1 | 11/2008 | Noma et al. |
| 2009/0026610 | A1 | 1/2009 | Kitagawa et al. |
| 2010/0038668 | A1 | 2/2010 | Noma |
| 2010/0164086 | A1 | 7/2010 | Noma et al. |

FOREIGN PATENT DOCUMENTS

| | | |
|---|---|---|
| JP | 5-21698 | 1/1993 |
| JP | 7-22630 | 1/1995 |
| JP | 9-321333 | 12/1997 |
| JP | 2000-349238 | 12/2000 |
| JP | 2001-085652 A | 3/2001 |
| JP | 2001-128072 | 5/2001 |
| JP | 2003-124478 | 4/2003 |
| JP | 2003-347476 | 12/2003 |
| JP | 2004-55674 | 2/2004 |
| JP | 2006-93367 | 4/2006 |
| KR | 10-2002-0048716 A | 6/2002 |
| KR | 10-2004-0077472 | 9/2004 |
| KR | 10-2004-0092435 A | 11/2004 |
| KR | 10-2005-0016041 A | 2/2005 |
| WO | WO-99/40624 | 8/1999 |
| WO | WO-2005/004195 | 1/2005 |
| WO | WO-2005/022631 | 3/2005 |

OTHER PUBLICATIONS

European Search Report, mailed Jun. 10, 2009, directed to European Patent Application No. 06026088.2; 5 pages.

Okada, K. et al., U.S. Office Action, mailed Jul. 22, 2009, directed to related U.S. Appl. No. 11/639,410; 16 pages.

Okada, K. et al., U.S. Office Action, mailed Jan. 7, 2010, directed to related U.S. Appl. No. 11/639,410; 12 pages.

Okada, K. et al., U.S. Office Action mailed Aug. 4, 2010, directed to U.S. Appl. No. 11/639,410; 14 pages.

Kitagawa et al., U.S. Office Action mailed Sep. 15, 2010, directed to related U.S. Appl. No. 12/177,696; 12 pages.

Okada, K. et al., U.S. Office Action mailed Jan. 7, 2011, directed to U.S. Appl. No. 11/639,410; 17 pages.

Noma, T. et al., U.S. Office Action, mailed Mar. 11, 2009, directed to a related U.S. Appl. No. 11/639,411; 11 pages.

Okada, K. et al., U.S. Office Action, mailed Jan. 3, 2008, directed to a related U.S. Appl. No. 11/639,410; 11 pages.

Okada, K. et al., U.S. Office Action, mailed Jun. 25, 2008, directed to a related U.S. Appl. No. 11/639,410; 13 pages.

Okada, K. et al., U.S. Office Action, mailed Dec. 30, 2008, directed to a related U.S. Appl. No. 11/639,410; 15 pages.

* cited by examiner

SEMICONDUCTOR DEVICE

CROSS-REFERENCE OF THE INVENTION

This application claims priority from Japanese Patent Application No. 2007-112336, the content of which is incorporated herein by reference in its entirety.

BACKGROUND OF THE INVENTION

1. Field of the Invention

The invention relates to a semiconductor device having a capacitor element.

2. Description of the Related Art

In order to reduce variation of a voltage level by influence of electromagnetic noise to prevent malfunction of a semiconductor die, a capacitor element called a bypass capacitor has been mounted on a terminal (a source terminal or a ground terminal) of a semiconductor die conventionally.

For example, Japanese Patent Application Publication No. Hei 05-021698 discloses a semiconductor device in which a semiconductor die and an external capacitor element called a die capacitor are mounted on the same substrate and packaged in a die form as a whole.

Japanese Patent Application Publication No. 2000-349238 discloses a semiconductor device formed with a capacitor element functioning as a bypass capacitor by using a multi-layered wiring layer on a semiconductor substrate and an interlayer insulation film between these.

However, although the structure using the external capacitor element as described in Japanese Patent Application publication No. Hei 05-021698 obtains large capacitance in the capacitor element, it needs a space for mounting the capacitor element on the substrate. Therefore, it is difficult to reduce the size of the device as a whole.

Furthermore, since recent semiconductor dies operate fast, high frequency (frequency of several hundreds MHz or more) electromagnetic noise is likely to increase by a high speed switching operation of a transistor to degrade operation characteristics. Therefore, a technique of effectively removing such electromagnetic noise is desired.

One method of reducing influence of electromagnetic noise is that a semiconductor die and a capacitor element are formed adjacent as much as possible to reduce the impedance and inductance of a wiring (a source wiring or a ground wiring) connecting these. However, the wiring may be extended long for a layout design in some cases, and when the semiconductor die and the capacitor element are individual components there is a limitation on the adjacent formation of these.

As described above, the structure having the external capacitor element has a problem of difficulty in realizing both the size reduction of the semiconductor device and the reduction of an influence of electromagnetic noise.

On the other hand, the conventional structure having the capacitor element formed in the same semiconductor device as described in Japanese Patent Application publication No. 2000-349238 may reduce the impedance and inductance of the wiring more than the case using the external capacitor element, but it requires a large area for obtaining enough capacitance to effectively remove high frequency electromagnetic noise.

Therefore, this has a problem of difficulty in size reduction of the semiconductor device since other functional elements (e.g. a driver circuit or a logic circuit formed by a transistor or the like, wirings connected to these, or the like) other than the capacitor element are formed on the same semiconductor substrate.

Therefore, the invention provides a semiconductor device which has a capacitor element therein to achieve size reduction of the device, the capacitor element having larger capacitance than conventional. Such a semiconductor device reduces an influence of electromagnetic noise.

SUMMARY OF THE INVENTION

The invention is for solving the above problem and its feature is as follows. The invention provides a semiconductor device including: a semiconductor substrate; a semiconductor integrated circuit formed on a front surface of the semiconductor substrate; a pad electrode connected to the semiconductor integrated circuit; a capacitor electrode formed contacting a back surface of the semiconductor substrate; an insulation film formed on a side surface of the semiconductor substrate and the capacitor electrode; and a wiring layer formed on the insulation film so as to overlap the capacitor electrode and connected to the pad electrode; wherein the capacitor electrode, the insulation film and the wiring layer form a capacitor.

DETAILED DESCRIPTION OF THE INVENTION

A first embodiment of the invention will be described referring to figures. FIGS. 1 to 9 are cross-sectional views and plan views showing a process of manufacturing a semiconductor device in order. The manufacturing process described below is performed using a wafer form semiconductor substrate and a number of semiconductor devices are formed in a matrix configuration along predetermined dicing lines as borders, although the description is given about a process of forming one of these semiconductor devices for convenience.

Figure 1:
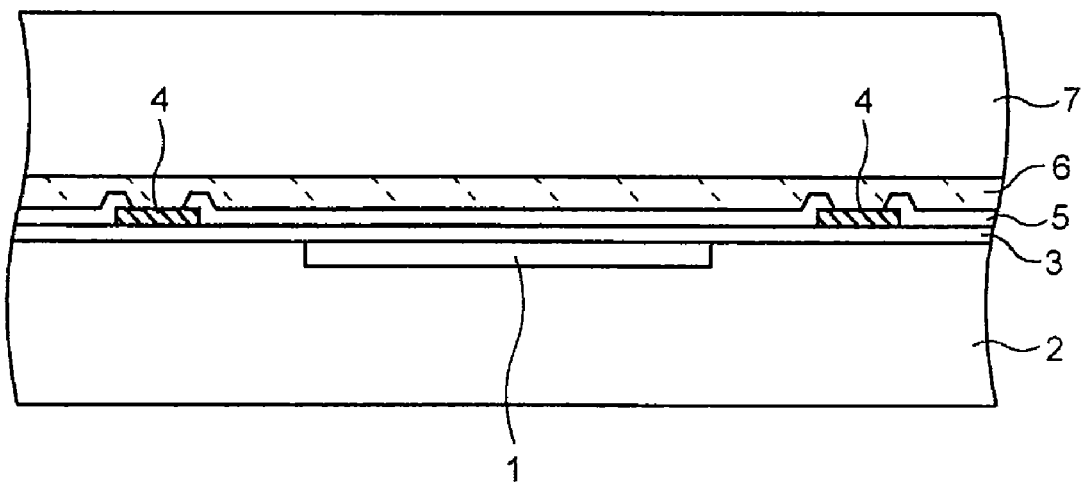
FIG. 1 is a cross-sectional view for explaining a method of manufacturing a semiconductor device of a first embodiment of the invention.

First, as shown in FIG. 1, a semiconductor substrate 2 made of silicon (Si) or the like is prepared, of which the front surface is formed with a semiconductor integrated circuit 1 (e.g. a driver circuit or a logic circuit formed by integrating semiconductor elements such as a light receiving element such as a CCD sensor, a CMOS sensor or an illumination sensor, a light emissive element or a transistor, wirings connected to these, or the like). The semiconductor substrate 2 is about 300 to 700 μm in thickness, for example. Then, a first insulation film 3 (e.g. a silicon oxide film formed by a thermal oxidation method, a CVD method, or the like) is formed on the front surface of the semiconductor substrate 2 to have a thickness of, for example, 2 μm.

Then, a metal layer made of aluminum (Al), an aluminum alloy, copper (Cu) or the like is formed by a sputtering method, a plating method or other deposition method, and then the metal layer is etched using a resist layer (not shown) as a mask to form pad electrodes 4 having a thickness of 1 μm on the first insulation film 3. The pad electrodes 4 are electrodes for external connection electrically connected to the semiconductor integrated circuit 1 or its peripheral elements through wirings (not shown). A supply voltage, a ground voltage (or a reference voltage to the extent that it is not necessary 0 volts) or various signals are supplied from conductive terminals 13a, 13b and 13c, which will be described below, to the semiconductor integrated circuit 1, the semiconductor substrate 2 and so on through the pad electrodes 4. Although the pad electrodes 4 are disposed on the both sides of the semiconductor integrated circuit 1 in FIG. 1, the position is not limited to this and these may be also disposed on the semiconductor integrated circuit 1.

Then, a passivation film 5 is formed on the front surface of the semiconductor substrate 2 (e.g. a silicon nitride film formed by a CVD method), covering the pad electrodes 4 partially or completely. In FIG. 1, the passivation film 5 is formed so as to cover the pad electrodes 4 partially.

Then, a supporting body 7 is attached to the front surface of the semiconductor substrate 2 including the pad electrodes 4 with an adhesive layer 6 made of epoxy resin, polyimide (e.g. photosensitive polyimide), resist, acrylic or the like being interposed therebetween. When the semiconductor integrated circuit 1 includes a light receiving element or a light emissive element, the adhesive layer 6 is preferably made of a suitable transparent material having light transmitting property since it is a passage of light emitted from the semiconductor integrated circuit 1 or entering the semiconductor integrated circuit 1.

The supporting body 7 may be a film form protection tape or a rigid substrate made of glass, quartz, ceramic, metal or the like, or may be made of resin, for example. The supporting body 7 has a function of supporting the semiconductor substrate 2 and protecting the surface of the element thereon. When the semiconductor integrated circuit 1 includes a light receiving element or a light emissive element, the supporting body 7 is made of a transparent or semitransparent material having light transmitting property.

Then, back-grinding is performed to the back surface of the semiconductor substrate 2 with a back surface grinder to thin the semiconductor substrate 2 to a predetermined thickness (e.g. about 100 μm). The grinding process may be replaced by an etching process, or a combination of a grinder and an etching process. There is also a case where the grinding process is not necessary depending on application or specification of an end-product and the initial thickness of the provided semiconductor substrate 2.

Figure 2:
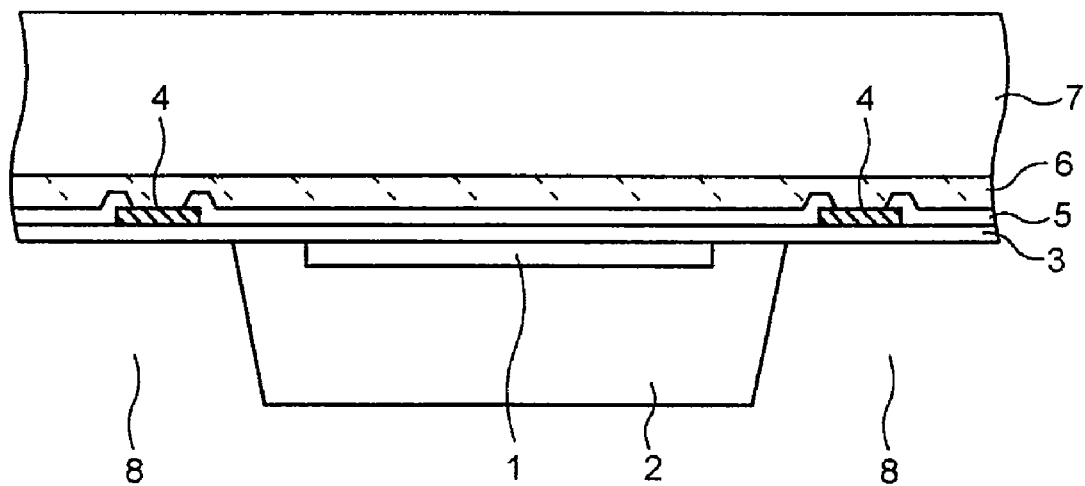
FIG. 2 is a cross-sectional view for explaining the method of manufacturing the semiconductor device of the first embodiment of the invention.

Then, as shown in FIG. 2, the semiconductor substrate 2 is selectively etched only in regions corresponding to the pad electrodes 4 from the back surface of the semiconductor substrate 2 to partially expose the first insulation film 3. Hereafter, this exposed portion is referred to as an opening 8.

Figure 3A:
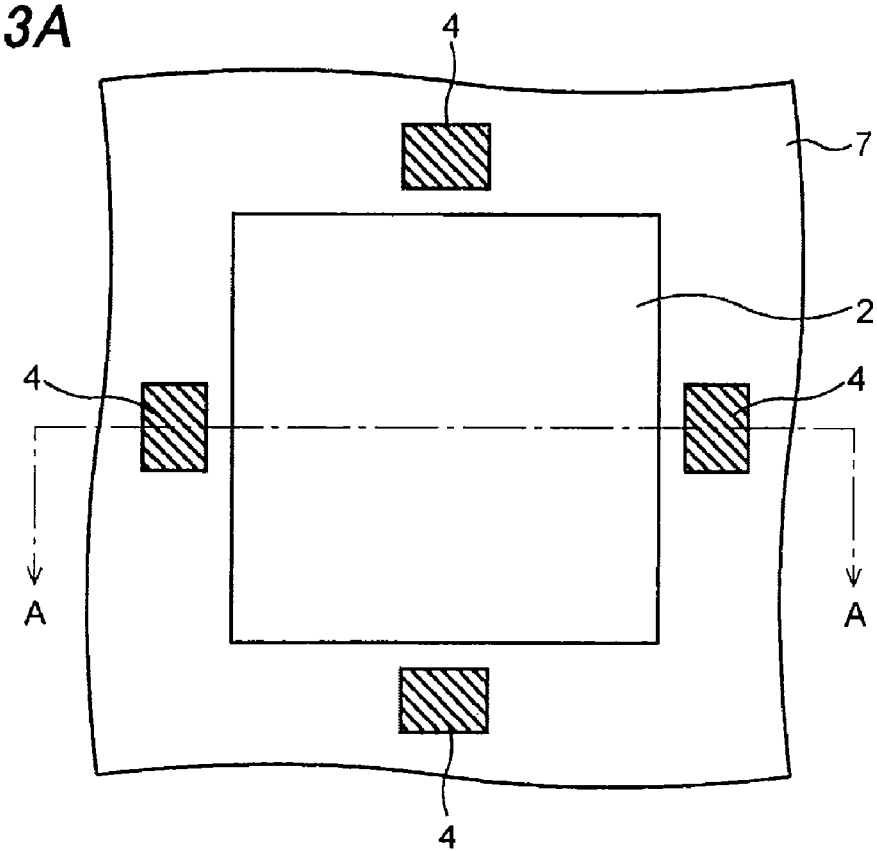
FIGS. 3A and 3B are a plan view for explaining the method of manufacturing the semiconductor device of the first embodiment of the invention.
Figure 3B:
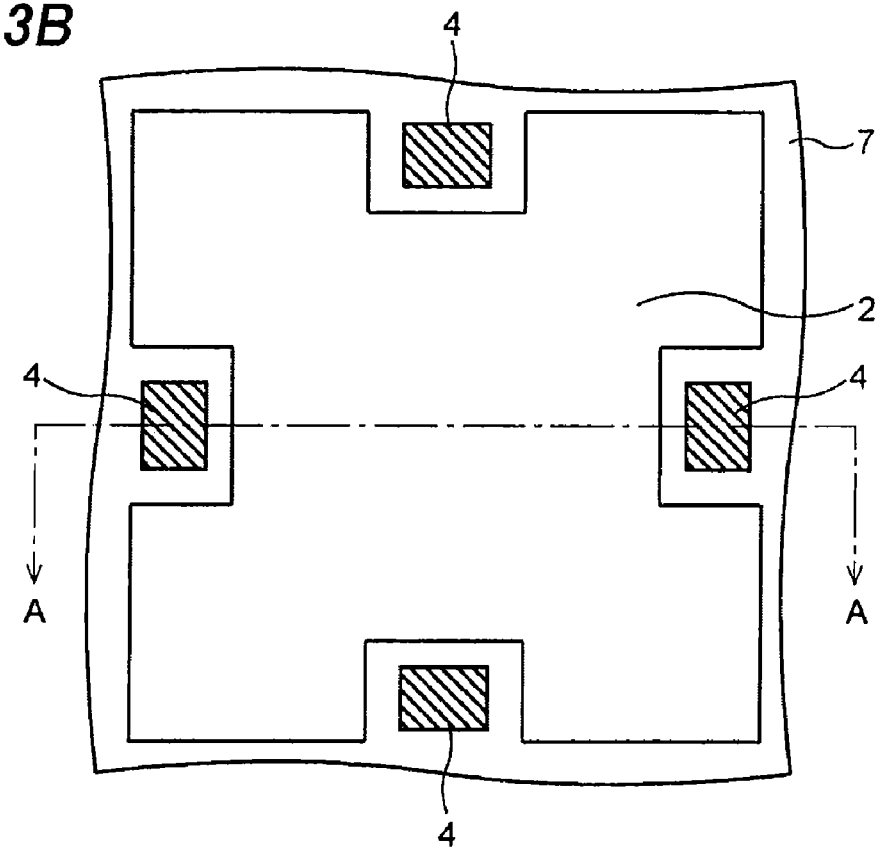

This selective etching of the semiconductor substrate 2 will be described referring to FIGS. 3A and 3B. FIGS. 3A and 3B are schematic plan views on the semiconductor substrate 2 side, and FIG. 2 corresponds to a cross-sectional view of FIGS. 3A and 3B along line A-A.

As shown in FIG. 3A, the semiconductor substrate 2 may be etched into an almost rectangular shape smaller than the supporting body 7. It is noted that the openings 8 shown in FIG. 2 form a lattice-like structure in a plan view, and one lattice is shown in FIG. 3A. Alternatively, as shown in FIG. 3B, the semiconductor substrate 2 may be etched only in a region formed with the pad electrodes 4 so as to have an uneven periphery. The latter provides the larger overlapping area between the semiconductor substrate 2 and the supporting body 7 and the semiconductor substrate 2 remains near the periphery of the supporting body 7. Therefore, the latter structure is preferable for enhancing the support strength of the supporting body 7 for the semiconductor substrate 2. Furthermore, since the latter structure prevents the supporting body 7 from warping due to the difference in coefficient of thermal expansion between the semiconductor substrate 2 and the supporting body 7, cracking or separation in the semiconductor device is prevented. It is noted that the semiconductor substrate 2 may be designed into other plane shape than the shapes shown in FIGS. 3A and 3B. Hereafter, a description will be given about the manufacturing process in the case where the semiconductor substrate 2 is etched as shown in FIG. 3A.

Furthermore, although the sidewall of the semiconductor substrate 2 is etched obliquely so that the width of the semiconductor substrate 2 is wider on the front surface side in this embodiment, the semiconductor substrate 2 may be etched to have the constant width and form the sidewall perpendicular to the main surface of the supporting body 7.

Figure 4:
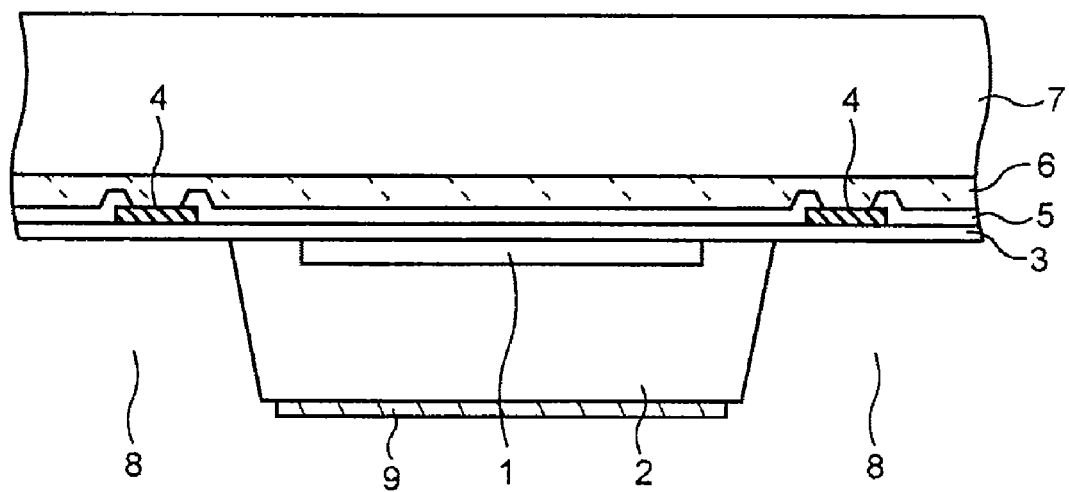
FIG. 4 is a cross-sectional view for explaining the method of manufacturing the semiconductor device of the first embodiment of the invention.
Figure 5:
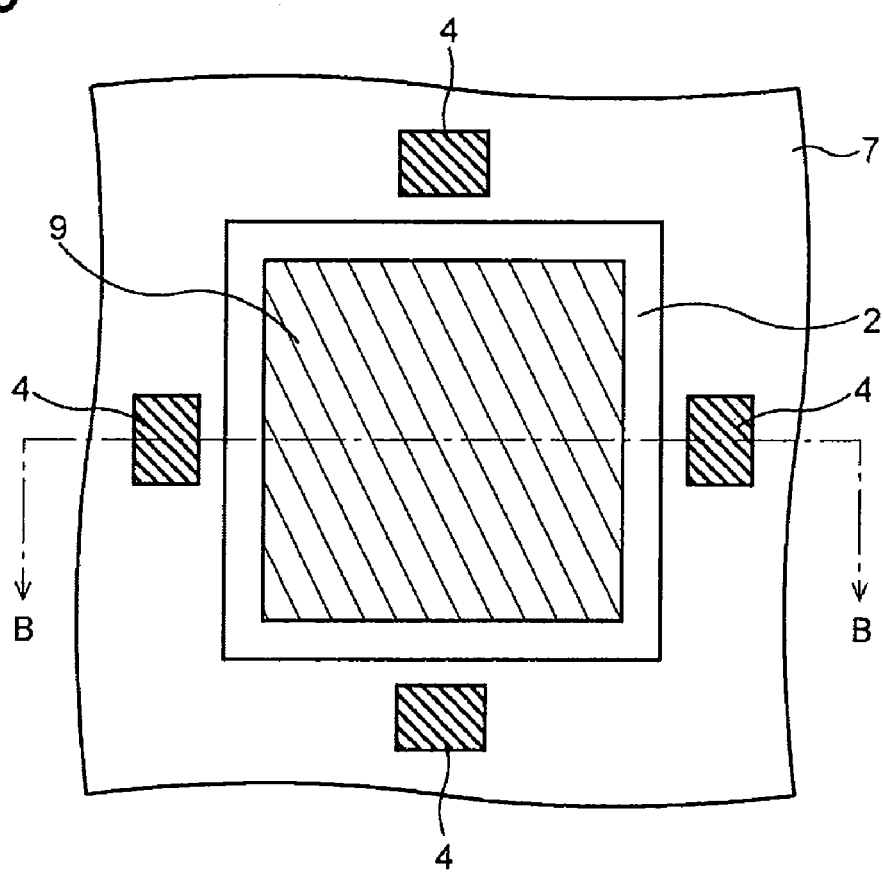
FIG. 5 is a plan view for explaining the method of manufacturing the semiconductor device of the first embodiment of the invention.

Then, by a CVD method, a sputtering method or other deposition method, a capacitor electrode 9 made of, for example, a metal material such as aluminum, gold or silver is formed on the back surface of the semiconductor substrate 2 as shown in FIGS. 4 and 5 to have a thickness of, for example, about 1 to 2 μm. Alternatively, the capacitor electrode 9 may be formed after the back-grinding of the semiconductor substrate 2 and then the opening 8 may be formed by selectively etching both of the capacitor electrode 9 and the semiconductor substrate 2. The capacitor electrode 9 forms one electrode of a capacitor 16 as described below, and is fixed to the same potential (usually a ground potential) as that of the semiconductor substrate 2 in actual use. The larger area of the capacitor electrode 9 is more preferable for obtaining the capacitor element having as large capacitance as possible. FIG. 5 is a schematic plan view of FIG. 4 on the semiconductor substrate 2 side, and FIG. 4 is a cross-sectional view of FIG. 5 along line B-B.

Then, a second insulation film 10 is formed on the side and back surfaces of the semiconductor substrate 2 including in the opening 8 and on the capacitor electrode 9. This second insulation film 10 is a silicon oxide film or a silicon nitride film formed by a plasma CVD method, for example.

Figure 6:
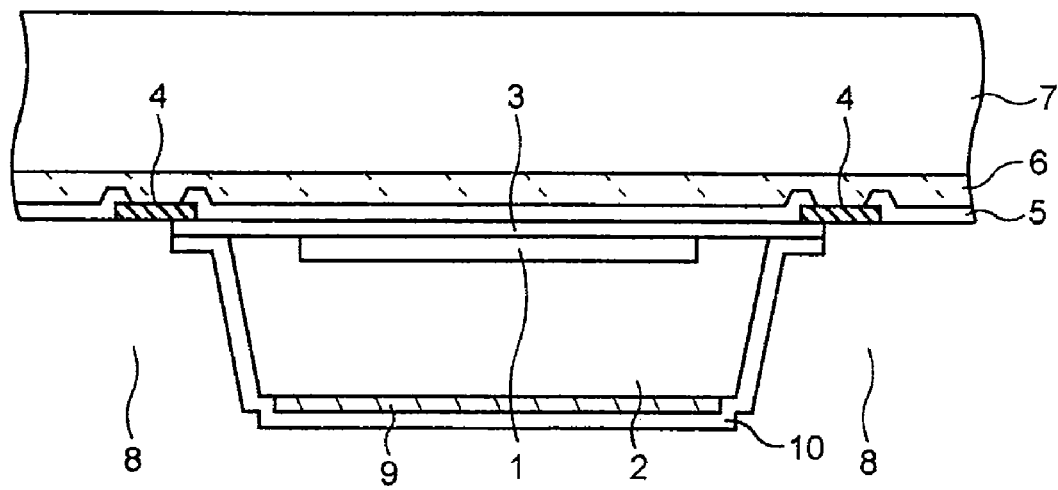
FIG. 6 is a cross-sectional view for explaining the method of manufacturing the semiconductor device of the first embodiment of the invention.

Then, the first insulation film 3 and the second insulation film 10 are selectively etched using a photoresist layer (not shown) as a mask as shown in FIG. 6. By this etching, the first insulation film 3 and the second insulation film 10 formed in a region from a portion of the pad electrodes 4 to dicing lines are selectively removed to expose at least a portion of the pad electrodes 4 on the bottom of the opening 8.

Figure 7:
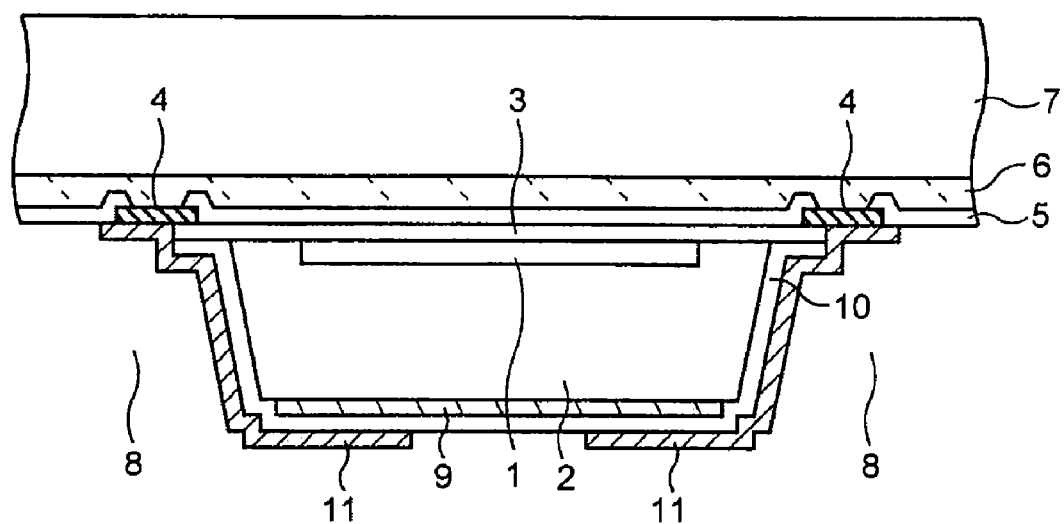
FIG. 7 is a cross-sectional view for explaining the method of manufacturing the semiconductor device of the first embodiment of the invention.
Figure 9:
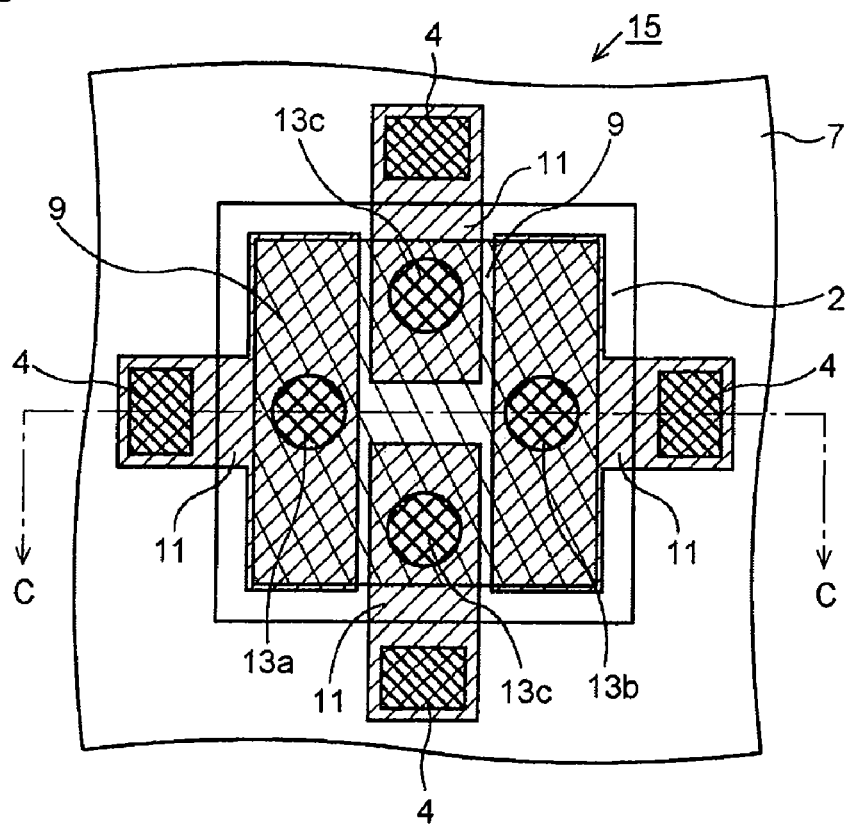
FIG. 9 is a plan view for explaining the method of manufacturing the semiconductor device of the first embodiment of the invention.

Then, a metal layer made of aluminum (Al), copper (Cu) or the like, which is to be wiring layers 11, is formed by a sputtering method, a plating method or other deposition method. Then, the metal layer is etched using a photoresist layer (not shown) as a mask to form the wiring layers 11 having a thickness of, for example, 1 μm on a portion of the pad electrodes 4 and on the second insulation film 10 as shown in FIGS. 7 and 9. The wiring layers 11 are formed along the side and back surfaces of the semiconductor substrate 2, covering the pad electrodes 4 and the second insulation film 10, and overlap the capacitor electrode 9 as shown in FIG. 9 when viewed from right above the semiconductor substrate 2.

The capacitor electrode 9 and the wiring layers 11 are preferably made of the same materials (e.g. aluminum) and formed by the same methods (e.g. a sputtering method). This advantageously simplifies the manufacturing process and reduces the manufacturing cost.

Then, an electrode connection layer (not shown) (e.g. a lamination layer of a nickel layer and a gold layer) is formed covering the wiring layers 11. The electrode connection layer is formed because the wiring layers 11 made of aluminum or the like and the conductive terminals 13a, 13b and 13c made of solder or the like are rather difficult to be attached together and for the purpose of preventing the material of the conductive terminals 13a, 13b and 13c from entering the wiring layers 11 side. Alternatively, the electrode connection layer may be formed after the formation of a protection layer 12. Then, as shown in FIG. 8, the protection layer 12 made of a resist material such as a solder resist is formed on the side and back surfaces of the semiconductor substrate 2.

Figure 8:
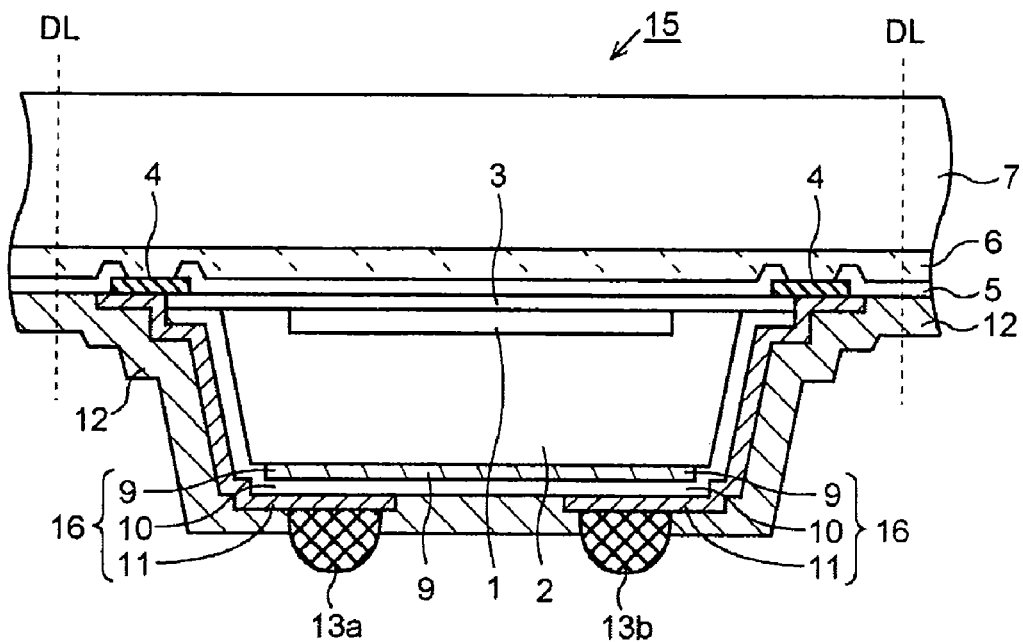
FIG. 8 is a cross-sectional view for explaining the method of manufacturing the semiconductor device of the first embodiment of the invention.

Then, openings are formed in predetermined regions (the regions where the conductive terminals are to be formed) of the protection layer 12, a conductive material (e.g. solder) is formed on the electrode connection layer exposed in each of the openings by screen printing, and the conductive material is reflowed by a heat treatment, thereby forming the ball-shaped conductive terminals 13a, 13b and 13c as shown in FIGS. 8 and 9. The conductive terminal 13a is a terminal for supplying a supply voltage, the conductive terminal 13b is a terminal for supplying a ground voltage, and the conductive terminals 13c are terminals relating to various input/output signals. The method of forming the conductive terminals 13a, 13b and 13c is not limited to this, and an electrolytic plating method, a so-called dispensing (coating) method in which solder or the like is applied in predetermined regions with a dispenser, or the like may be used for the formation. In this manner, the pad electrodes 4 are electrically connected to the conductive terminals 13a, 13b and 13c through the wiring layers 11.

Then, the protection layer 12, the supporting body 7 and so on are cut along dicing lines DL which are borders of a number of semiconductor devices to separate these into individual semiconductor devices 15. The method of separating the semiconductor devices includes a dicing method, an etching method, a laser cutting method and so on. The supporting body 7 may remain attached to the semiconductor substrate 2, or may be removed before or after the semiconductor devices 15 are separated.

The chip size package type semiconductor device 15 is thus completed by this process. The semiconductor device 15 is mounted on a printed board or the like through the conductive terminals 13a, 13b and 13c. FIG. 9 is a schematic plan view of the semiconductor device 15 on the semiconductor substrate 2 side, and FIG. 8 corresponds to a cross-sectional view of FIG. 9 along line C-C.

In the semiconductor device 15 of the first embodiment, the capacitor electrode 9, the second insulation film 10 and the wiring layers 11 are layered on the back surface of the semiconductor substrate 2 in this order, and these form the capacitors 16. Therefore, for example, when the conductive terminal 13a is connected to a terminal for supplying a supply voltage VDD and the conductive terminal 13b is connected to a terminal for supplying a ground voltage GND, electromagnetic noise entering inside from the conductive terminals 13a, 13b and 13c and electromagnetic noise occurring in the semiconductor integrated circuit 1 by a switching operation of a transistor or the like are removed by the charging and discharging effects of the capacitors 16, thereby preventing the malfunction of the semiconductor integrated circuit 1.

Since the capacitance of this capacitor 16 is proportional to the area where the capacitor electrode 9 and the wiring layer 11 overlap and the dielectric constant of the second insulation film 10 (a dielectric), and inversely proportional to the thickness of the second insulation film 10, desired capacitance is obtainable by changing each of the parameters.

Furthermore, since the capacitors 16 are formed on the back surface of the semiconductor substrate 2, it is not necessary to change the layout on the front surface of the semiconductor substrate 2 by the formation of the capacitors 16, and the size of the semiconductor device is not increased. Furthermore, since almost the whole back surface of the semiconductor device 15 is usable as the capacitors 16, the capacitance is easily increased. Therefore, the structure of this embodiment realizes both the size reduction of the semiconductor device and the increase of the capacitance of the capacitor element.

Furthermore, since the capacitor 16 and the semiconductor integrated circuit 1 are formed in the same semiconductor die, the wiring between the capacitor 16 and the semiconductor integrated circuit 1 is shorter than in the case of using an external capacitor element, and thus the impedance and inductance thereof are reduced, the device has an excellent effect of removing electromagnetic noise. In one experiment, the equivalent effect of removing electromagnetic noise to the effect of a device provided with an external capacitor element having, for example, 0.01 μF capacitance was realized by providing the capacitor 16 having the capacitance of about 100 to 500 pF. In this manner, although the capacitance of the capacitor 16 is smaller than that of the general external capacitor element, since the capacitor 16 is disposed in the same semiconductor die and very near the semiconductor integrated circuit 1, the effect of removing electromagnetic noise is enhanced. Therefore, the structure having the capacitor 16 may be applied to a device which needs a high-speed switching operation of a transistor and easily generates high frequency electromagnetic noise (the frequency of several hundred MHz or more).

Figure 10:
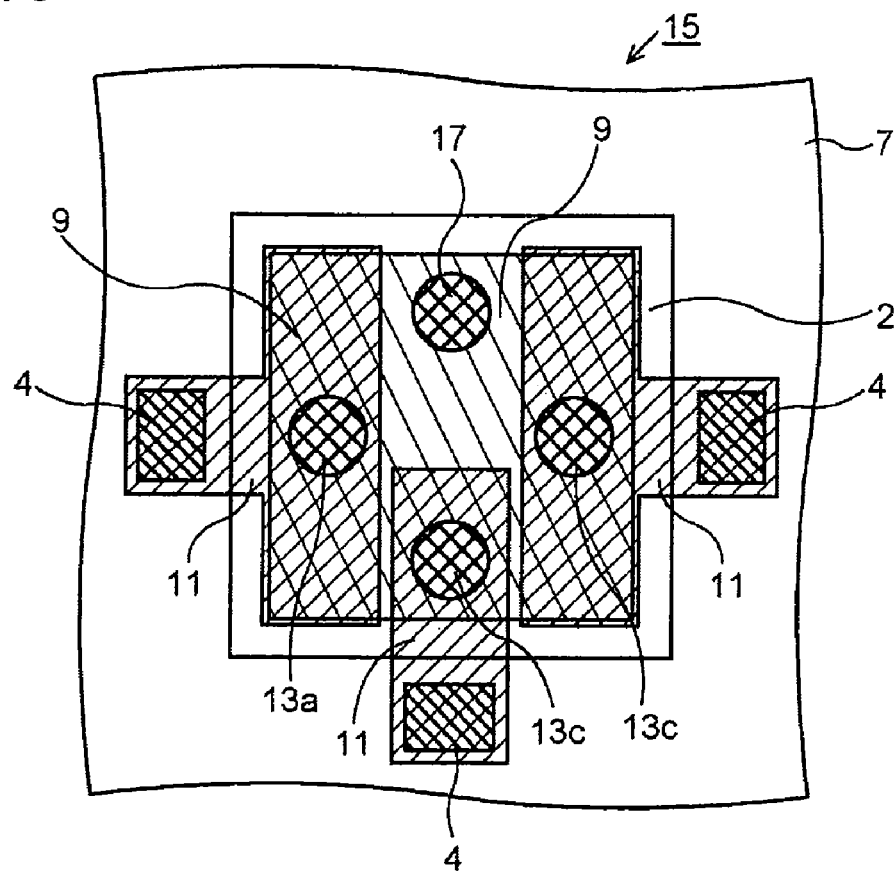
FIG. 10 is a plan view for explaining a modification of the semiconductor device of the first embodiment of the invention.

While a predetermined voltage (usually a ground voltage) is supplied from the conductive terminal 13b to the semiconductor substrate 2 and the capacitor electrode 9 through the wiring layer 11 and the pad electrode 4 in the structure shown in FIGS. 8 and 9, the structure shown in FIG. 10 may be possible, in which a conductive terminal 17 directly connected to the capacitor electrode 9 is formed on the back surface of the semiconductor substrate 2 and a predetermined voltage is directly supplied from the conductive terminal 17 to the capacitor electrode 9 and the semiconductor substrate 2. In this structure, the conductive terminal 17 and the capacitor electrode 9 contact, so that an influence of electromagnetic noise entering from the conductive terminal 17 is advantageously reduced. The conductive terminal 17 is formed by forming an opening in the protection layer 12 to the capacitor electrode 9 and by the similar process to the process of forming the described conductive terminals 13a, 13b and 13c (by a screen-printing method, a plating method or the like).

Next, a second embodiment of the invention will be described referring to figures. The same numerals are given to the same components as those of the first embodiment and a description thereof is omitted.

Figure 11:
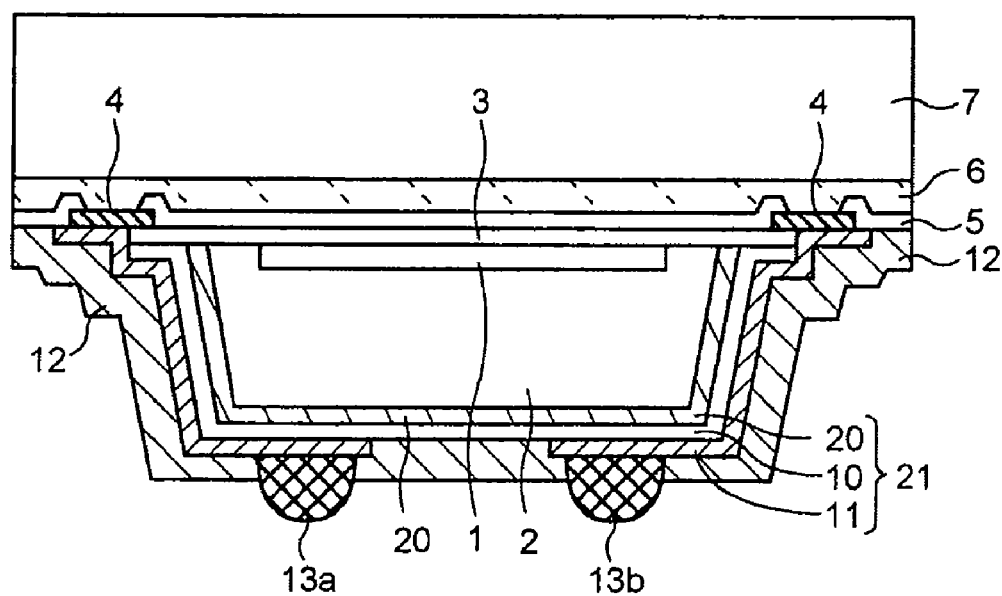
FIG. 11 is a cross-sectional view for explaining a semiconductor device of a second embodiment of the invention.

The capacitor electrode 9 in the first embodiment is formed only on the back surface of the semiconductor substrate 2. In the second embodiment, as shown in FIG. 11, the whole side and back surfaces of the semiconductor substrate 2 are covered by a capacitor electrode 20, and the capacitor electrode 20, the second insulation film 10 and the wiring layers 11 form capacitors 21. The capacitance of the capacitor 21 in this structure is increased by the amount of the area of the electrode 20 formed not only on the back surface of the semiconductor substrate 2 but also on the side surface thereof. The effect of removing electromagnetic noise is enhanced more than that of the structure of the first embodiment.

Next, a third embodiment of the invention will be described referring to figures. The same numerals are given to the same components as those of the above described embodiments and a description thereof is omitted.

Figure 12:
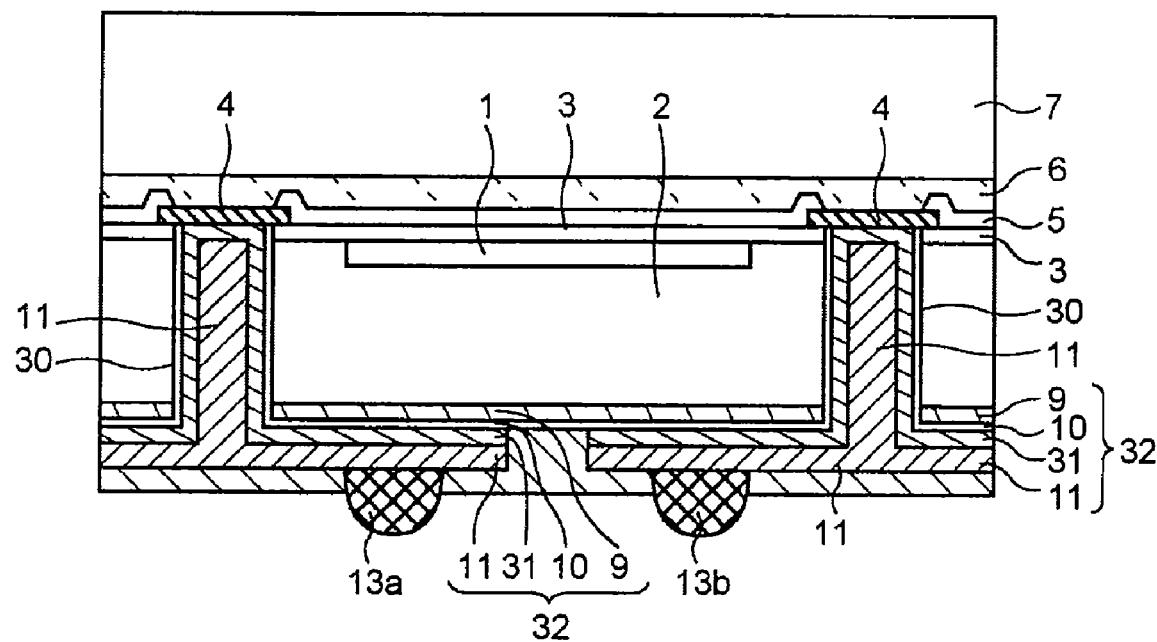
FIG. 12 is a cross-sectional view for explaining a semiconductor device of a third embodiment of the invention.

In a semiconductor device of the third embodiment, as shown in FIG. 12, via holes 30 are formed from the back surface of the semiconductor substrate 2 to the pad electrodes 4, barrier metal layers 31 are formed in the via holes 30 and on the back surface of the semiconductor substrate 2, and the wiring layers 11 made of metal such as aluminum, copper or the like are formed on the barrier metal layers 31. The barrier metal layers 31 are made of a metal material such as, for example, a titanium (Ti) layer, a titanium nitride (TiN) layer, a tantalum (Ta) layer, a tantalum nitride (TaN), a titanium tungsten (TiW) layer or the like, and connected to the pad electrodes 4 on the bottoms of the via holes 30 (near the front surface of the semiconductor substrate 2).

The capacitor electrode 9 is formed between the back surface of the semiconductor substrate 2 and the second insulation film 10, contacting the back surface of the semiconductor substrate 2, and the capacitor electrode 9, the second insulation film 10, the barrier metal layers 31 and the wiring layers 11 form capacitors 32. In this manner, the capacitors 32 may be formed by applying the invention to the so-called penetrating electrode type semiconductor device.

This penetrating electrode type semiconductor device is formed by, for example, preparing the semiconductor substrate 2 formed with the semiconductor integrated circuit 1 and the pad electrodes 4 with the first insulation film 3 being interposed therebetween, forming the via holes 30 penetrating the semiconductor substrate 2 in positions corresponding to the pad electrodes 4, forming the capacitor electrode 9 on the back surface of the semiconductor substrate 2, forming the second insulation film 10 covering the inner sidewalls of the via holes 30 and the back surface of the semiconductor substrate 2, removing the second insulation film 10 on the bottoms of the via holes 30, forming the barrier metal layers 31 in the via holes 30, forming the wiring layers 11 made of metal such as aluminum, copper or the like in the via holes 30 and on the back surface of the semiconductor substrate 2 by, for example, an electrolytic plating method, and forming the protection layer 12 and the conductive terminals 13a, 13b. It is noted that this method is for describing the outline of the process of manufacturing the penetrating electrode type semiconductor device of this embodiment as an example. The method is not limited to this, and the capacitor electrode 9 may be formed before the formation of the via holes 30.

Figure 13:
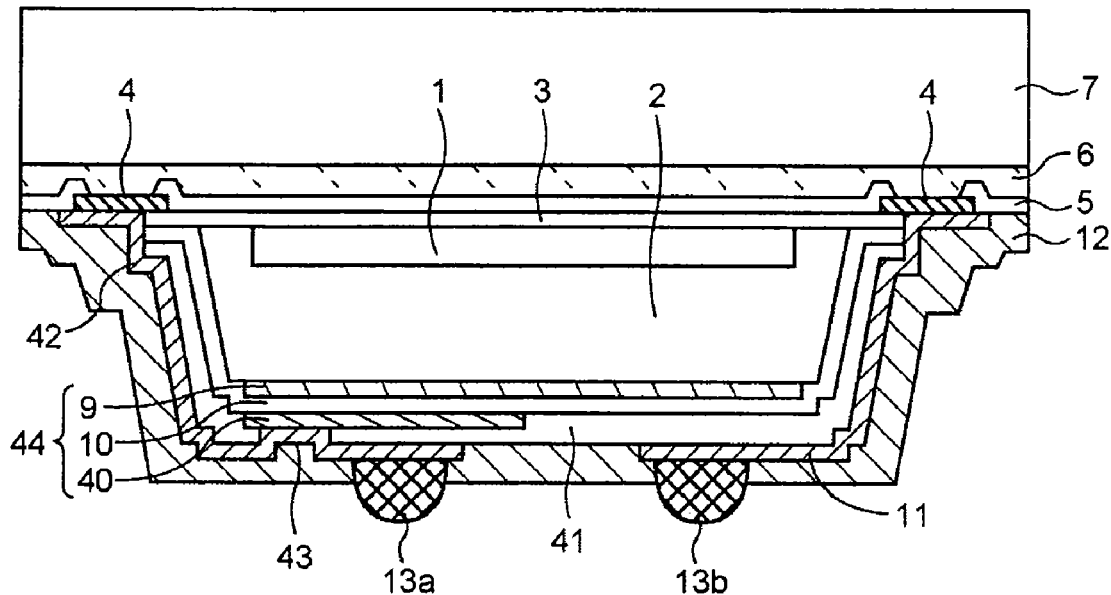
FIG. 13 is a cross-sectional view for explaining a semiconductor device of a fourth embodiment of the invention.
Figure 14:
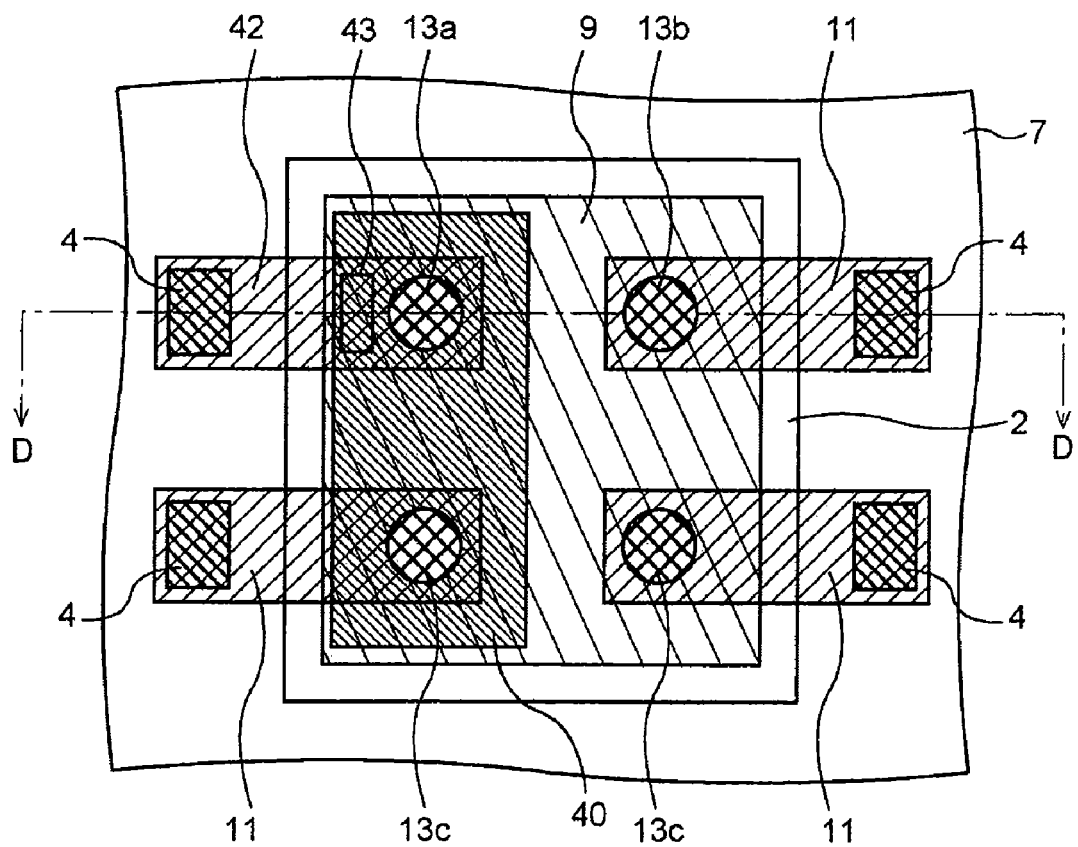
FIG. 14 is a plan view for explaining the semiconductor device of the fourth embodiment of the invention.

Next, a fourth embodiment of the invention will be described referring to FIGS. 13 and 14. FIG. 14 is a schematic plan view of a semiconductor device of the fourth embodiment on the semiconductor substrate 2 side, and FIG. 13 corresponds to a cross-sectional view of FIG. 14 along line D-D. The same numerals are given to the same components as those of the above described embodiments and a description thereof is omitted.

In the semiconductor device of the fourth embodiment, a wiring layer 40 is formed on the second insulation film 10 on the back surface of the semiconductor substrate 2 so as to overlap the capacitor electrode 9. A third insulation film 41 made of a silicon oxide film, a silicon nitride film or the like is formed so as to cover the wiring layer 40 and the second insulation film 10, and the wiring layers 42, 11 connected to the pad electrodes 4 are formed on the third insulation film 41 along the side and back surfaces of the semiconductor substrate 2. An opening 43 is formed in a portion of the third insulation film 41, reaching the wiring layer 40, and the wiring layer 40 and the wiring layer 42 are connected through this opening 43.

In the semiconductor device of the fourth embodiment, the capacitor electrode 9, the second insulation film 10 and the wiring layer 40 are layered on the back surface of the semiconductor substrate 2 in this order, and thus these form a capacitor 44. Therefore, for example, when the conductive terminal 13a is connected to a terminal for supplying a supply voltage VDD and the conductive terminal 13b is connected to a terminal for supplying a ground voltage GND, electromagnetic noise infiltrating inside from the conductive terminals 13a, 13b and 13c and electromagnetic noise occurring in the semiconductor integrated circuit 1 by a switching operation of a transistor or the like are removed by the charging and discharging effects of the capacitor 44, thereby preventing the malfunction of the semiconductor integrated circuit 1. In this manner, there are various structures of the capacitor on the back surface of the semiconductor substrate 2.

The invention is not limited to the above described embodiments, and modifications are possible within the scope of the invention. For example, although the BGA (Ball Grid Array) type semiconductor device having the ball-shaped conductive terminals is used in the description of the above embodiments, the invention may be applied to a LGA (Land Grid Array) type or other CSP (Chip Size Package) type semiconductor device. The invention is widely applicable as a semiconductor device having a capacitor element.

In the structures explained above, the semiconductor integrated circuit is formed on one surface of the semiconductor substrate and the capacitor is formed on the other surface thereof, thereby realizing a smaller semiconductor device having a capacitor with larger capacitance than conventional.

What is claimed is:

1. A semiconductor device comprising:
a semiconductor substrate;
a semiconductor integrated circuit formed on a front surface of the semiconductor substrate;
a pad electrode disposed on the side of the front surface so as to be electrically connected to the semiconductor integrated circuit, the pad electrode having a top surface and a bottom surface opposite from the top surface, the pad electrode being disposed on the side of the front surface of the semiconductor substrate so that the bottom surface is closer to the front surface of the semiconductor substrate than the top surface;

a capacitor electrode disposed on a back surface of the semiconductor substrate;

an insulation film disposed on the capacitor electrode; and a wiring layer disposed on the insulation film and physically in direct contact with the bottom surface of the pad electrode, wherein the capacitor electrode, the insulation film and the wiring layer are configured to form a capacitor, and the capacitor electrode, the insulation film and the wiring layer extend from the back surface of the semiconductor substrate to a side surface of the semiconductor substrate so that the extended portions of the capacitor electrode, the insulation film and the wiring layer form an additional capacitance to the capacitor.

2. The semiconductor device of claim 1, further comprising a supporting body attached to the semiconductor substrate.

3. The semiconductor device of claim 1, wherein the capacitor electrode and the semiconductor substrate are configured to receive a reference voltage.

4. The semiconductor device of claim 1, further comprising a front surface insulating film disposed on the front surface of the semiconductor substrate, wherein the pad electrode is disposed on the front surface insulating film.

5. A semiconductor device comprising:
a semiconductor substrate;
a semiconductor integrated circuit formed on a front surface of the semiconductor substrate;
a pad electrode disposed on the side of the front surface so as to be electrically connected to the semiconductor integrated circuit;
a first capacitor electrode disposed on a back surface of the semiconductor substrate;
a first insulation film disposed on the first capacitor electrode;
a second capacitor electrode disposed on the first insulation film;
a second insulation film disposed on the second capacitor electrode;
a wiring layer disposed on the second insulation film and electrically connected to the pad electrode,
wherein the first capacitor electrode, the first insulation film, the second capacitor electrode, the second insulation film and the wiring layer form on the back surface of the semiconductor substrate a stack of three conducting layers and two insulation layers,
the wiring layer is electrically connected to the second capacitor electrode through an opening formed in the second insulation film, and
the first capacitor electrode, the first insulation film and the second capacitor electrode are configured to form a capacitor.

6. The semiconductor device of claim 5, wherein the semiconductor substrate has a via hole penetrating the semiconductor substrate, and the first insulation film and the wiring layer extend from the back surface of the semiconductor substrate into the via hole.

7. The semiconductor device of claim 5, further comprising a supporting body attached to the semiconductor substrate.

8. The semiconductor device of claim 5, wherein the capacitor electrode and the semiconductor substrate are configured to receive a reference voltage.

9. The semiconductor device of claim 5, further comprising a front surface insulating film disposed on the front surface of the semiconductor substrate, wherein the pad electrode is disposed on the front surface insulating film.

* * * * *